(12) United States Patent
Cranford, Jr. et al.

(10) Patent No.: US 7,383,160 B1
(45) Date of Patent: *Jun. 3, 2008

(54) METHOD AND APPARATUS FOR CONSTRUCTING A SYNCHRONOUS SIGNAL DIAGRAM FROM ASYNCHRONOUSLY SAMPLED DATA

(75) Inventors: Hayden C. Cranford, Jr., Cary, NC (US); Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 114 days.

This patent is subject to a terminal disclaimer.

(21) Appl. No.: 11/427,860

(22) Filed: Jun. 30, 2006

(51) Int. Cl.
*G06F 19/00* (2006.01)
(52) U.S. Cl. .................. 702/189; 702/69; 702/106; 375/226; 370/503; 331/2; 331/11
(58) Field of Classification Search ............... 702/189, 702/67–69, 106; 324/76.53; 375/226; 331/2, 331/11; 370/503
See application file for complete search history.

(56) References Cited

U.S. PATENT DOCUMENTS

| | | | |
|---|---|---|---|
| 4,703,448 A | 10/1987 | Muething, Jr. | |
| 5,889,435 A | 3/1999 | Smith et al. | |
| 6,185,509 B1 | 2/2001 | Wilstrup et al. | |
| 6,295,315 B1 | 9/2001 | Frisch et al. | |
| 6,366,631 B1 | 4/2002 | Nakayama et al. | |
| 6,522,122 B2 | 2/2003 | Watanabe et al. | |
| 6,640,103 B1 | 10/2003 | Inman et al. | |
| 6,661,836 B1 | 12/2003 | Dalal et al. | |
| 6,728,311 B1 | 4/2004 | Waschura et al. | |
| 6,785,622 B2 | 8/2004 | Nygaard, Jr. | |
| 6,836,738 B2 | 12/2004 | Sepp et al. | |
| 6,841,985 B1 | 1/2005 | Fetzer | |
| 6,871,152 B2 | 3/2005 | Nygaard, Jr. | |
| 6,934,648 B2 | 8/2005 | Hanai et al. | |
| 6,995,621 B1 | 2/2006 | Culler | |
| 7,203,610 B2 | 4/2007 | Tabatabaei et al. | |
| 2002/0103609 A1 | 8/2002 | Kuyel | |

(Continued)

OTHER PUBLICATIONS

U.S. Appl. No. 11/279,651, filed Apr. 13, 2006, Cranford, Jr. et al.

(Continued)

*Primary Examiner*—John E Barlow, Jr.
*Assistant Examiner*—Hien X Vo
(74) *Attorney, Agent, or Firm*—Mitch Harris; Andrew M. Harris; Casimer K. Salys (57) ABSTRACT

A method a low cost and production-integrable technique for providing a signal diagram. The data signal is edge-detected and asynchronously sampled (or alternatively a clock signal is latched). The data signal or a second signal is compared to a settable threshold voltage and sampled. The edge and comparison data are folded according to a swept timebase to find a minimum jitter period. The crossing of the signal diagram edges is determined from a peak of a histogram of the folded edge data. A histogram of ratios of the sample values versus displacement from the position of the crossing location is generated for each threshold voltage. The technique is repeated over a range of settable threshold voltages. Then, the ratio counts are differentiated across the histograms with respect to threshold voltage, from which a signal diagram is populated.

10 Claims, 11 Drawing Sheets

U.S. PATENT DOCUMENTS

| | | |
|---|---|---|
| 2002/0118738 A1 | 8/2002 | Whitlock |
| 2004/0143406 A1 | 7/2004 | Nishikobara et al. |
| 2005/0036578 A1 | 2/2005 | Heidel et al. |
| 2005/0069031 A1 | 3/2005 | Sunter et al. |
| 2005/0107970 A1 | 5/2005 | Franch et al. |
| 2005/0111536 A1 | 5/2005 | Cranford, Jr. et al. |
| 2005/0177758 A1 | 8/2005 | Stickle |
| 2006/0023778 A1 | 2/2006 | Bergman et al. |
| 2006/0069967 A1 | 3/2006 | Almy et al. |
| 2006/0251200 A1 | 11/2006 | Miller |

OTHER PUBLICATIONS

Jenkins, et al.,"An On-Chip Jitter Measurement Circuit with Sub-picosecond Resolution", Proceedings of ESSCIRC, Grenoble, France. Jan. 2005.

Restle, et al., "Timing Uncertainty Measurements on the Power5 Microprocessor", IEEE 2004 Solid-State Circuits Conference, Jun. 2004.

Xia, et al., "Self-Refereed on-chip Jitter Measurement Circuit Using Vernier Oscillators", Proceedings of the IEEE Computer Society Annual Symposium on VLSI, IEEE, 2005, US.

Ong, et al. "A Scalable On-Chip Jitter Extraction Technnique" Proceedings of the IEEE VLSI Test Symposium 2004, IEEE, 2004, US.

Larsson, et al. "Measuring high-bandwidth signals in CMOS circuits", Electronics Letters, vol. 29, No. 30, Sep. 1993, IEE.

Ho, et al., "Applications of On-Chip Samplers for Test and Measurement. of Integrated Circuits", 1998 VLSI Symposium, IEEE, 1998.

Takamiya, et al., "An On-chip 100GHz-Sampling Rate 8-channel Sampling Oscilloscope with Embedded Sampling Clock Generator", 2002 ISSCC.

Abaskharoun, et al., "Strategies for On-chip Sub-nanosecond Signal Capture and Timing Measurements", IEEE, 2001, US.

Ong, et al. "Jitter Spectral Extraction for Multi-gigahertz Signal", (DAC) IEEE, 2004, US.

Fig. 7A Original data

Fig. 7B Transitions using correct Δt

Fig. 7C Jitter vs. Δt

Fig. 7D Jitter histogram

Fig. 9B
Create grid and sweep comparator

Fig. 9A
Original data

Fig. 9C
Bin data and calculate CDF

Fig. 9D
Differentiate CDF to get eye

METHOD AND APPARATUS FOR CONSTRUCTING A SYNCHRONOUS SIGNAL DIAGRAM FROM ASYNCHRONOUSLY SAMPLED DATA

This invention was made with Government support under NBCH3039004, DARPA. THE GOVERNMENT HAS CERTAIN RIGHTS IN THIS INVENTION.

CROSS-REFERENCE TO RELATED APPLICATIONS

This application is related to co-pending U.S. application Ser. No. 11/279,651 entitled "METHOD AND APPARATUS FOR DETERMINING JITTER AND PULSE WIDTH FROM CLOCK SIGNAL COMPARISONS" filed on Apr. 13, 2006; Ser. No. 11/427,831, entitled "METHOD OF GENERATING AN EYE DIAGRAM FOR INTEGRATED CIRCUIT TRANSMITTED SIGNALS" and Ser. No. 11/427,940, entitled "METHOD AND APPARATUS FOR DETERMINING DATA SIGNAL JITTER VIA ASYNCHRONOUS SAMPLING" filed concurrently with this application, by the same Inventors and assigned to the same Assignee. The specifications of the above-referenced applications are incorporated herein by reference.

BACKGROUND OF THE INVENTION

1. Technical Field

The present invention relates generally to digital interface circuits, and more particularly, to circuits and systems that evaluate data integrity and jitter via an eye diagram or other data diagram display.

2. Description of the Related Art

Eye diagrams are commonly used to display the integrity and jitter characteristics of a data signal. Typically, eye diagrams are used to view binary data, but have also been used in analog systems to view a modulation pattern or other analog signal variation and can also be applied to digital signals having more than two levels.

In general, an eye diagram is displayed by synchronizing the data channel of an oscilloscope with the data rate of the signal under observation. The result is that the display of the data window is made stationary via the synchronization of the timebase to the data rate, thereby permitting the observation of the amount and distribution of jitter at the data window edges, as well as observing the integrity of the data within the "eye", which is the generally empty area between the transition regions and between the two signal levels. For example, a change in data within the eye such as a spike, indicates a mechanism other than jitter that may cause data errors. At the edges of the eye, the width of the diagram gives and indication of the amount of jitter, and if gaps are seen in the transition regions, chaotic and other meta-stable phenomena can be observed as specific lines within the jitter.

Data jitter and integrity determination is necessary to evaluate the performance of high-speed interface components and interfaces, as well as other circuits where jitter affect the bit error rate (BER) and eye diagrams provide a valuable tool for such determination. Other types of signal diagrams may also be employed in synchronization with a data signal. For example, a second signal or power supply voltage may be observed for noise, crosstalk or other variation that is synchronous with the data signal used to synchronize the timebase.

In laboratory environments, high-accuracy laboratory instruments may be used to provide eye diagrams via stable reference clocks. However, the challenge of probing a very high frequency data signal and/or high-impedance data signal is significant, as the effects of the probe must be accounted for in the measurements and probe characteristics can vary over time and the probe compensation model may not be accurate under actual measurement conditions. Further, significant circuit area can be consumed in the impedance-matched and isolated output pads that permit such precision measurements. Such equipment is expensive and it is typically unfeasible to incorporate the equivalent of such instrumentation within production circuits.

On-chip sampling of a data signal is typically either performed using an internal global clock or an external sample clock with an internal delay line. Use of the internal global clock is limited in that clock jitter and data jitter cannot be separated. When an external sample clock is used, the delay accuracy, and thus the accuracy of the presumed positions of the sampled data, is difficult to control.

It is therefore desirable to provide a method and apparatus for generating a signal diagram that is low cost, can be at least partially integrated in a production circuit with no probing error.

SUMMARY OF THE INVENTION

The above-stated objectives of providing a low-cost apparatus and method for generating a signal diagram is provided in a method and apparatus.

The method analyzes raw data provided by the apparatus, and the performance of the method may be distributed between a test circuit and a workstation computer or may be completely embedded in a test instrument or production integrated circuit.

The method samples edges of a signal provided from an edge detector using a sampling clock signal that differs at least slightly in frequency from rational multiples of the data rate of interest. The method also collects the values of the signal or a second signal via comparison with a settable voltage threshold. Alternatively, a clock signal can be sampled rather than edge-detected and the samples used to provide the edge position indications.

The sampled edge position data is folded into a unit interval according to a guess of the relationship between the periods/frequencies of the sampling clock and the data rate. The guess is adjusted either over a range, or until an indication that the guess is correct is obtained, such as minimum jitter in the folded edge position data.

The period obtained above is used to generate a timebase to fold the edge position data and the signal value samples. The frequency or period of neither the sampling clock signal or edge data signal needs to be known in order to further analyze the data, only the relationship between the two, as determined by the method described above.

The values of the signal value samples are then folded according to period determined above and the entire process is repeated over a range of settable threshold voltage, in order to generate histograms of sampled data values for time slots within the period. The histograms correspond to the cumulative distribution function (cdf) for each threshold voltage, which are then differentiated to obtain the probability density function (pdf) for each threshold voltage. The pdfs can then be used to populate the signal diagram, which may be an eye diagram of the data signal that was edge-detected, or may be a signal diagram of another signal that was sampled along with the edges of the data signal.

Drift between the frequency of the sampling clock signal and the data signal providing the edge data can be removed from the analysis results by using a linear or other shift model to progress the guessed period across the sample set, and the exact frequency drift can be identified from the histogram having the minimum widths of peaks in the probability density function.

The sampling circuit can be included in a production die and the data collected by a workstation computer via direct probing or a boundary-scan data interface. Alternatively, a processing circuit or algorithm may be present or loaded into a production integrated circuit that includes a processor or a dedicated digital circuit use to conduct the above-described analysis. The analysis method may be embodied in a computer-program product containing stored program instructions for carrying out the steps of the method.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

Details of the invention and the uses thereof will be understood by a person of ordinary skill in the art, when reading the following detailed description of illustrative embodiment in conjunction with the accompanying drawings. Further objectives and advantages presented by the invention will be apparent in light of the following description and drawings, wherein like reference numerals indicate like components, and.

DESCRIPTION OF ILLUSTRATIVE EMBODIMENT

The present invention concerns the generation and display of signal diagrams, and in particular, the eye diagram of interface data signals. In order to produce accurate results, the capture of measurement data is generally performed by a sampling circuit within the interface (or other data-receiving circuit) rather than a separate test probe. However, the techniques of the present invention can be applied to and within test equipment, as well.

Primarily, the present invention provides new methods for generating and displaying a signal diagram obtained by sampling a signal under measurement with an asynchronous sampling clock simultaneously with sampling edge position of either the signal under measurement of or another signal for which synchronous variation in the signal under measurement is to be observed. If the reference source is a clock signal, then the clock signal can be sampled with a latch to obtain the edge positions, otherwise an edge detector is used. Rather than synchronizing the sampling clock with the signal under measurement or other reference source, as is done within a digital oscilloscope, the present invention resolves the sampled data to identify a relationship between the period of the signal for which edges that were sampled relative to the sampling clock. The method then analyzes the sample values of the signal under measurement according to the determined relationship between edge position samples and the sampling clock to generate the signal diagram.

Therefore, the sampling clock used to sample the signal under measurement and the signal for which edges are sample (and integer multiples of its frequency) must differ in frequency at least slightly and a sufficient number of samples must be collected so that jitter can be distinguished from variation due to slight frequency differences. Neither the period/frequency of the data signal under measurement (and optional other edge position data source) nor the sampling clock period/frequency need be known in order to generate the signal diagram. If the edge position data source and the signal under measurement are the same, then the generated signal diagram is an eye diagram of the signal under measurement.

Figure 1:
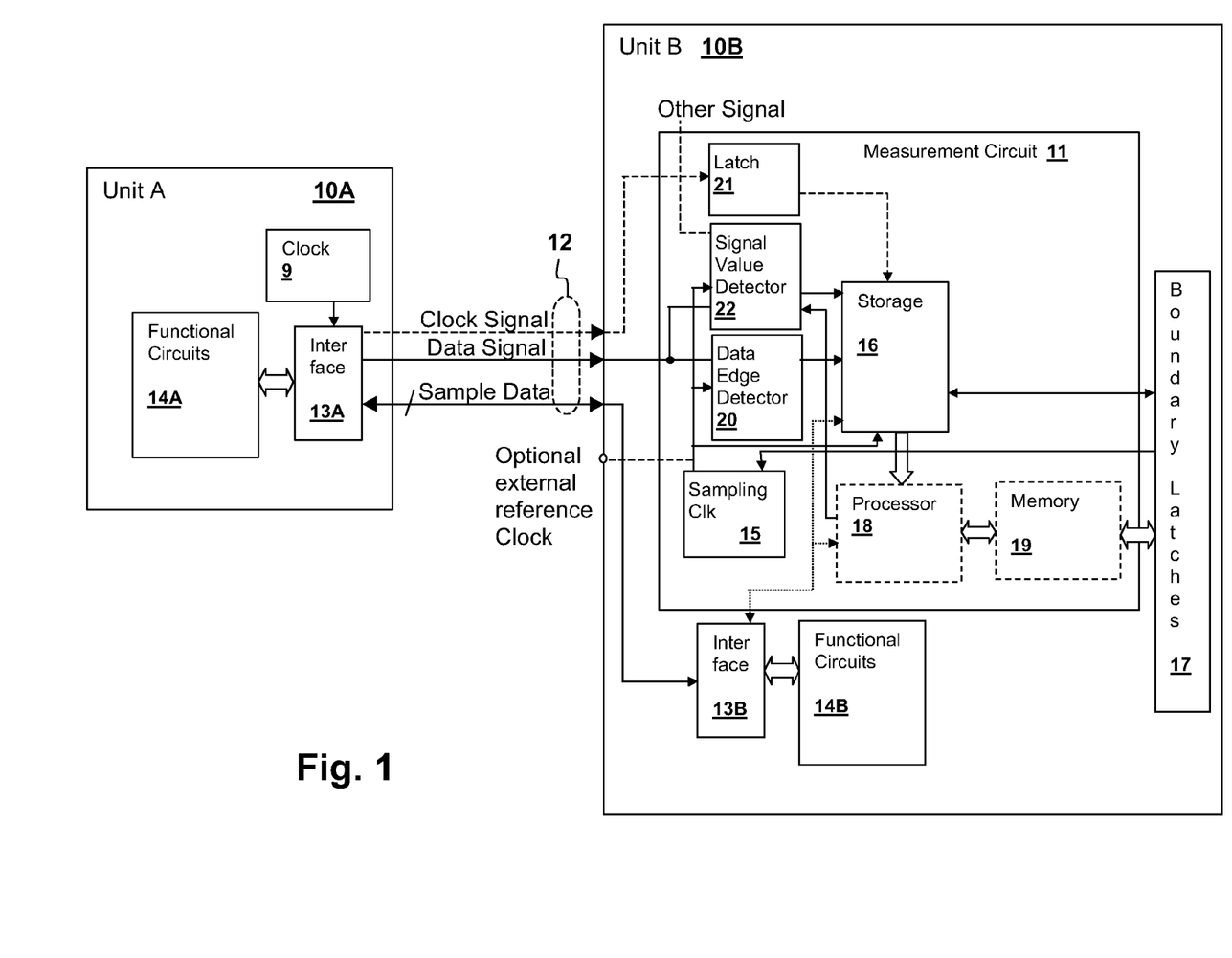
FIG. 1 is a block diagram of a first electronic unit connected by an interface to a second electronic interface in accordance with an embodiment of the invention.

With reference now to the figures, and in particular with reference to FIG. 1, there is depicted a block diagram of electrical units 10A and 10B connected by a wired interface or other channel 12 that includes one or more Data signals. Interface circuits 13A, 13B may be located within a device such as a computer peripheral, a computer system, or within integrated circuits interconnected within a system or may be a wireless device interface having a clock signal embedded in a received signal. Clock 9 provides for synchronous generation of data provided from electrical unit 10A and optional Clock signal provided on interface 12. Functional circuits 14A, 14B do not generally form part of the present invention, but perform the functions associated with the normal operation of units 10A and 10B. Functional circuit 14B is included to illustrate that the techniques of the present invention can be applied to a functional device rather than a laboratory model. However, in some instances, the circuits required to perform the measurements of the present invention will already be present in functional circuits 14B of a particular electrical unit 10B without modification, and the use of such functional circuits to perform data collection as input to a method according to an embodiment the present invention are contemplated herein.

The circuit required for data collection is illustrated separately as a measurement circuit 11 and includes a data edge detector 20, a sampling clock 15 and a storage 16 for samples of edges of interface 12 Data signal collected from the output of an edge detector 20 at edges of sampling clock 15. Alternatively, if the edge position reference source is a clock signal such as the Clock signal shown optionally provided from interface 12, then a latch 21 can be used to provide the edge position data that is stored in storage 16. Storage 16 also collects samples of the outputs of a signal value detector 22 at the same time that edge position samples are collected from data edge detector 20 (or alternatively from latch 21). Signal value detector, for the purposes of generating eye diagrams, receives the Data signal of interface 12, but may alternatively be provided with input from optional Other signals for which characteristics in synchronization with the Data signal may be observed (e.g., a power supply rail internal to electrical unit 10B might be observed for noise synchronous with Data signal).

A processor 18 and memory 19 are optionally included for performing methods according to the present invention, or the raw sample data from storage 16 may be clocked out by a test system via boundary latches 17 or otherwise read from unit 10B via interface 13B, e.g., by electrical unit 10A as Sample Data over interface 12. Also, if processor 18 and memory 19 are included, and the sampled data is processed locally, interface 13B and/or boundary latches 17 may be read to retrieve the results of the analysis performed by a method according to the present invention.

Some degree of tuning of sampling clock 15 must generally be provided, so that the sampling clock frequency will not land on an exact multiple of the data rate of the Data signal (or period of the Clock signal), thus generating a zero beat frequency that will yield only a signal dependent on the presence or absence of data signal edges in the folded data and not revealing the jitter, which will be used to determine the correct relationship between the data rate of the Data signal and the sampling clock. Sampling clock 15 is therefore shown coupled to boundary latches in order to provide to least a single bit adjustment that can change the clock frequency of sampling clock if needed to avoid sampling too close to a multiple of the data rate of the Data signal. Sampling clock 15 may also be optionally provided from an external source such as a test system.

Figure 2:
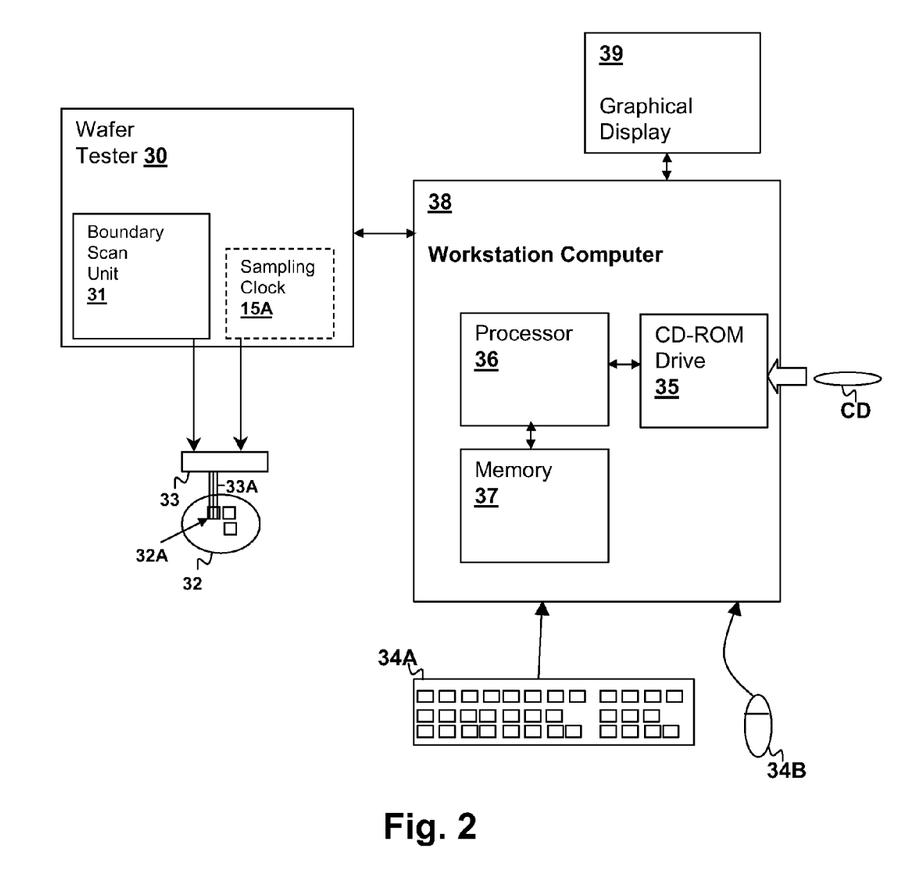
FIG. 2 is a pictorial diagram of a manufacturing tester and workstation computer connected to a device under measurement implementing a method in accordance with an embodiment of the present invention.

Referring now to FIG. 2, a wafer test system, in which methods according to an embodiment of the present invention are performed, is depicted. A wafer tester 30 includes a boundary scan unit 31 for providing stimulus to and reading data from a die 32A on a wafer under test 32, via a probe head 33 having electrical test connections 33A to die 32A. An optional sampling clock 15A is included for optionally providing a stable and accurate clock to the above-described sampling circuits within die 32A, to either improve the measurement results, or to provide additional measurement of the data rate of the data signal under measurement.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the sampled clock data (or analysis results from processor 18 and memory 19 of FIG. 1) can be retrieved. A CD-ROM drive 35 is also coupled to processor 36 for transfer of program products from media such as CD-ROM CD that contain program instructions for executing methods in accordance with embodiments of the present invention.

Workstation computer 38 is also coupled to a graphical display 39 for displaying program output such as the signal diagram computed by embodiments of the present invention, as well as graphical data such as the graphs depicted in FIGS. 7A-7E, 9A-9D, 10A-10B and 11A-11D as described below. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 2 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary scan data retrieval is illustrated, the techniques of the present invention may also be applied to a data interface including the loading of program code to memory 19 (FIG. 1) for execution by processor 18 (FIG. 1) incorporated on die 32A to an interface other than boundary scan unit 31, for example, via a dedicated test interface device that retrieves sampled clock data from storage 16 (FIG. 1) or test results from memory 19.

Figure 3A:
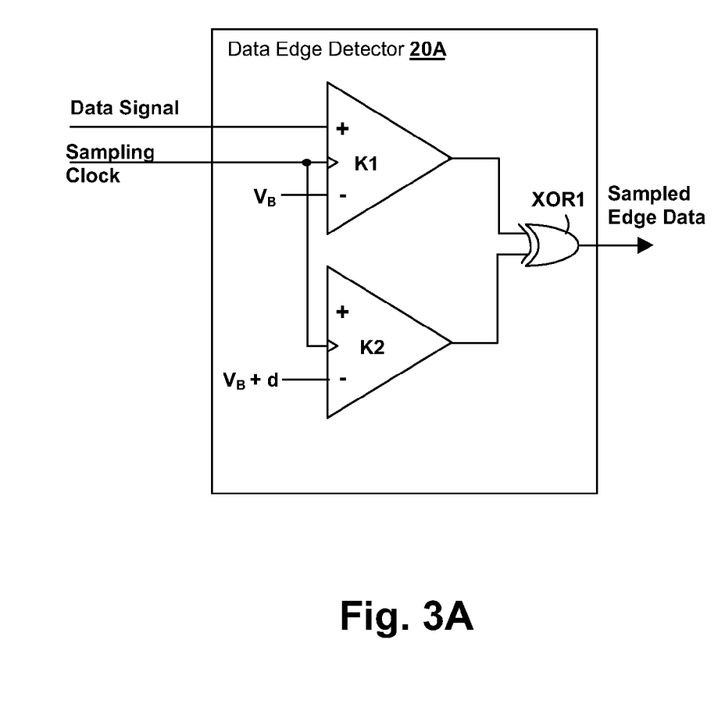
FIGS. 3A and 3B are schematics of differing edge detectors that may be employed in second electronic interface 10B of FIG. 1 in accordance with embodiments of the invention.

Referring now to FIG. 3A, a data edge detector circuit 20A as may be employed in measurement circuit 11 of FIG. 1 is depicted. Data edge detector 20A receives the Data Signal under measurement and the sampling clock signal. A first comparator K1 compares Data Signal to a reference bias voltage $V_B$ to provide an output that changes when Data Signal changes logical state. A second comparator K2 compares Data Signal to a slightly differing reference bias voltage $V_B+d$, causing the output of comparator K2 to change either slightly earlier or later than the output of K1, depending on the direction of the transition in Data Signal. A logical exclusive-OR gate XOR1 produces a logical high output only when the outputs of comparators K1 and K2 differ, thus providing an output signal that contains pulses in the near vicinity of the transitions of Data Signal.

Figure 3B:
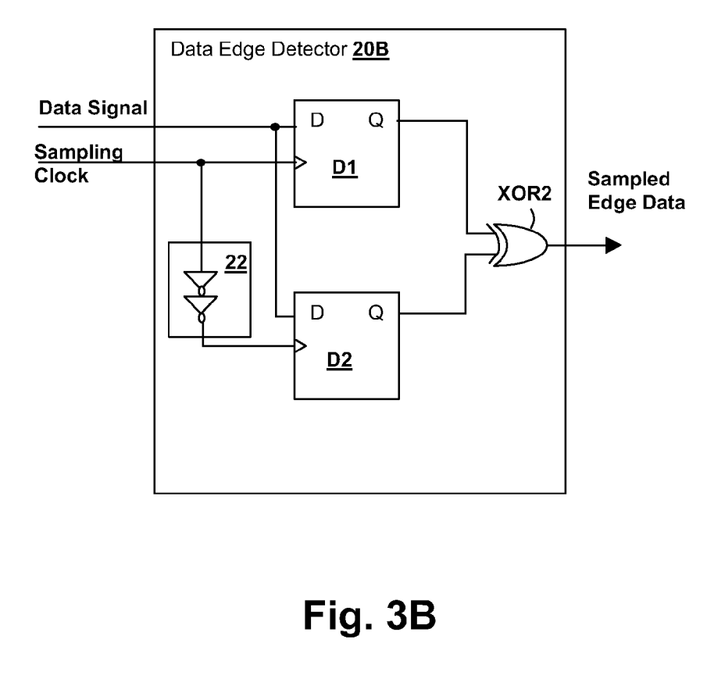

Referring now to FIG. 3B, a data edge detector circuit 20B as may be alternatively employed in measurement circuit 11 of FIG. 1 is depicted. Data edge detector 20B receives the Data Signal under measurement and the sampling clock signal. A first latch D1 latches the value of the Data Signal at an edge of the Reference Clock signal and a second latch D2 latches the value of the Data Signal at an edge of a delayed version of the Reference Clock signal as provided by delay 22. A logical exclusive-OR gate XOR2 produces a logical high output only when the outputs of latches D1 and D2 differ, thus providing an output signal that contains pulses in the near vicinity of the transitions of Data Signal.

Figure 4:
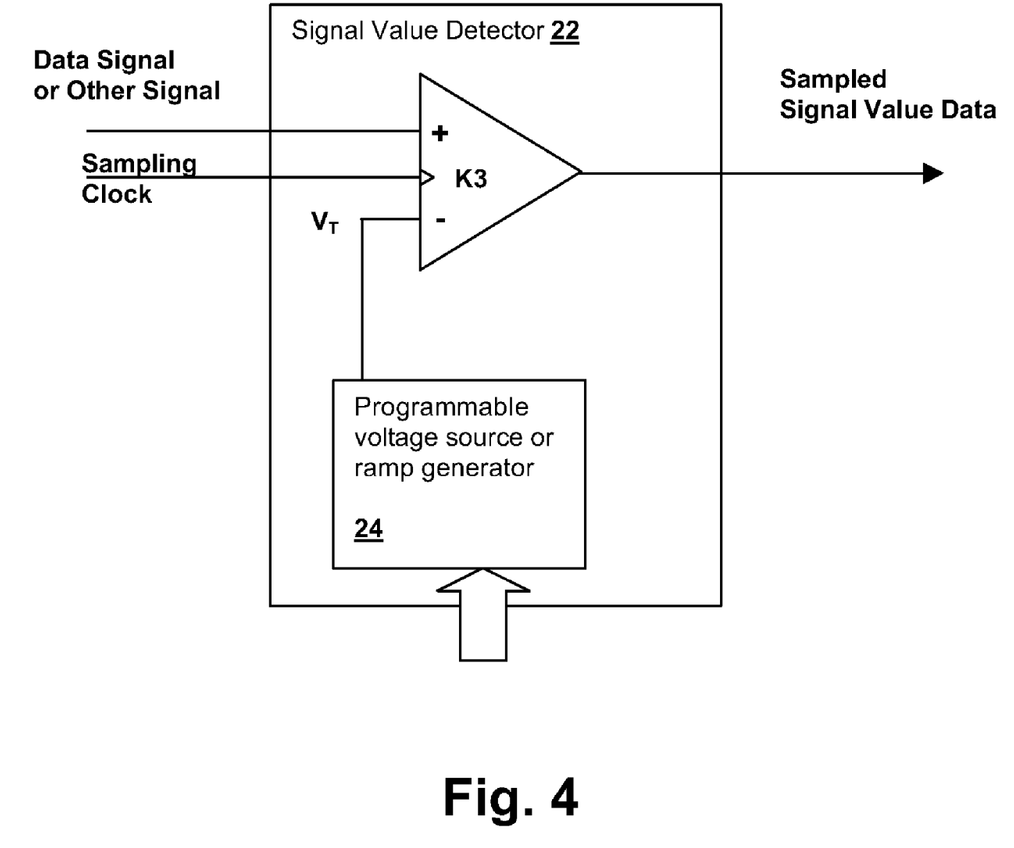
FIG. 4 is a schematic diagram of a signal value detector 22 of FIG. 1 in accordance with an embodiment of the invention.

Referring now to FIG. 4, a signal value detector circuit 22 as may be employed in measurement circuit 11 of FIG. 1 is depicted. Signal value detector 22 receives the Data Signal under measurement and the sampling clock signal. A comparator K3 compares Data Signal to a data value threshold voltage $V_T$ to provide an output that changes when Data Signal crosses a predetermined voltage. The output of comparator K3 clocked via Sampling Clock and the resultant data comparison value stored in storage 16 in conjunction with the samples of the edge position data provided by edge detector 20 (or latch 21, if the edge reference source is a clock signal). A programmable voltage source or ramp generator 24 is used to control data value threshold voltage $V_T$, so that the complete range of data voltage values can be sampled using a single comparator.

If the edge reference source is not a clock signal, a reasonably large number of edge samples is required due the edge detector output forming a very small portion of the overall data period. Therefore, the sample values may be encoded in storage via a run-length or other compression code, and also the number of edge samples collected may be larger than that of the data value samples. For example, the threshold voltage may be ramped or programmed to different values during the collection of data and edge values in one measurement so that the number of edge samples is larger than each individual set of per-threshold data samples. In order to conserve storage space, edge location values such as those stored in storage 16 of FIG. 1 may be stored with an encoding mechanism such as a run-length limited (RLL) or other compression technique that takes advantage of the relative sparse presence of detected edges in the data set. As mentioned above, the data comparison values may also be encoded.

Figure 5:
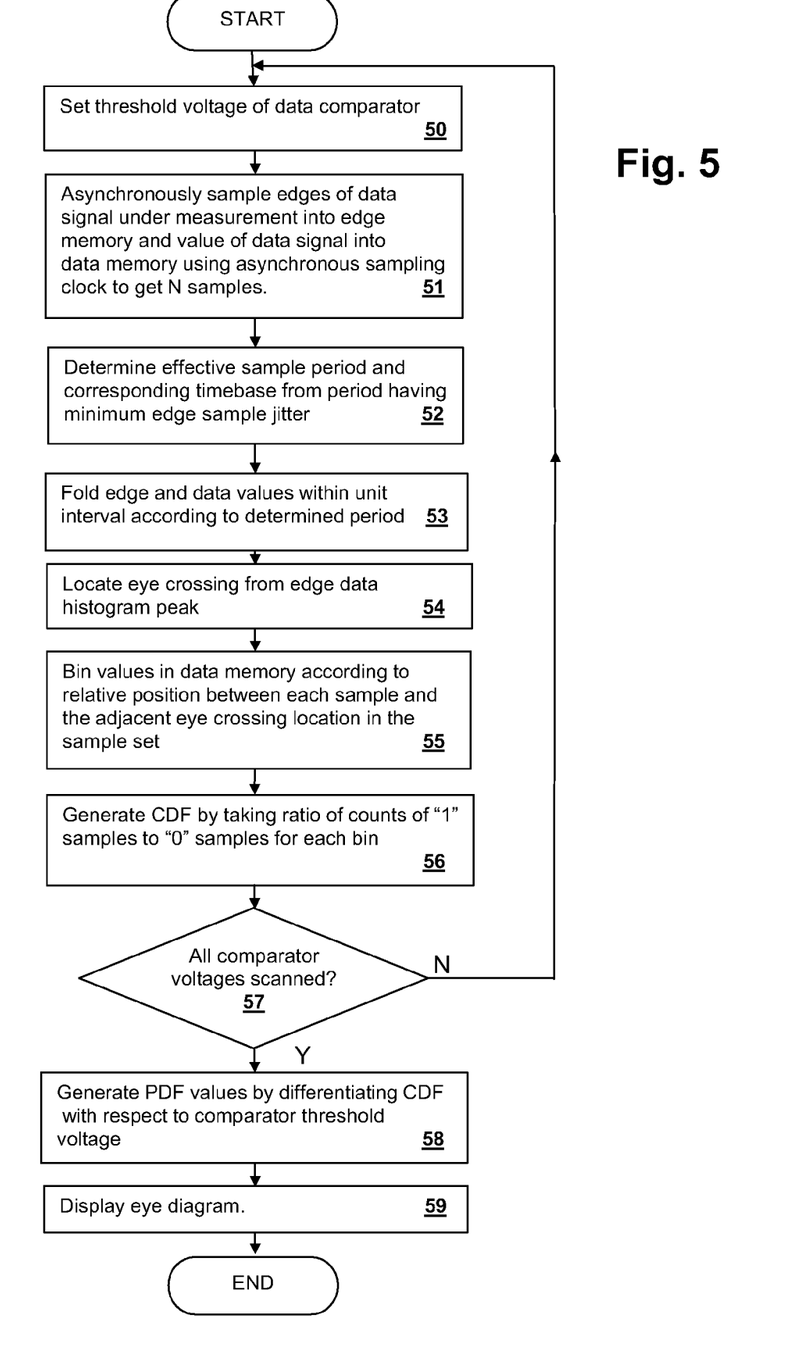
FIGS. 5 and 6 are flowcharts illustrating a method in accordance with an embodiment of the invention.

Referring now to FIG. 5, a method according to an embodiment of the present invention is illustrated in a flowchart. First, a threshold voltage value is set for the data comparator (step 50). The edges of the reference signal provided by edge detector 20 (or output of latch 21) and the comparison of the data signal under measurement with the threshold voltage are sampled with an asynchronous local sampling clock (step 51) to obtain N samples of each. Next, the effective sample period and corresponding timebase are determined from the period having the minimum jitter in the edge sample data (step 52), according to the steps described below with respect to FIG. 6. Then, the data comparison and edge detector samples are folded according to the period determined in step 52 into a unit interval and the eye crossing is located from the mode or mean of the histogram data that was gathered in step 52, as will be explained in further detail with reference to FIG. 6 below.

Next, the timebase is adjusted according to the relative position between each sample and the eye crossing location, and the data values are placed in histogram bins according to the timebase (step 55). The ratio of logical "1" counts to logical "0" counts is computed for each histogram bin, forming a histogram representing the cumulative distribution function of the data signal values for each position within the unit interval (step 56). Until all comparator threshold voltages ($V_T$) are scanned (decision 57), steps 50-56 are repeated for each threshold voltage. Finally, the signal diagram is generated by differentiating the cdf at each bin position with respect to the change in threshold voltage between the histograms, i.e., computing a rate of change of the count ratios in corresponding bins with respect to the change in threshold voltage between histograms (step 58). The result of the differentiation yields a histogram of the probability density across the period of the data signal, i.e., the pdf of the signal values. Next the eye diagram is displayed from the pdf histogram (step 59). If the method is used to generate a signal diagram as described above, rather than an eye diagram, the steps taken are the same; however, the histogram and derivative will not be the cdf and pdf of the data values, but rather the cdf and pdf of the signal under measurement.

Figure 6:
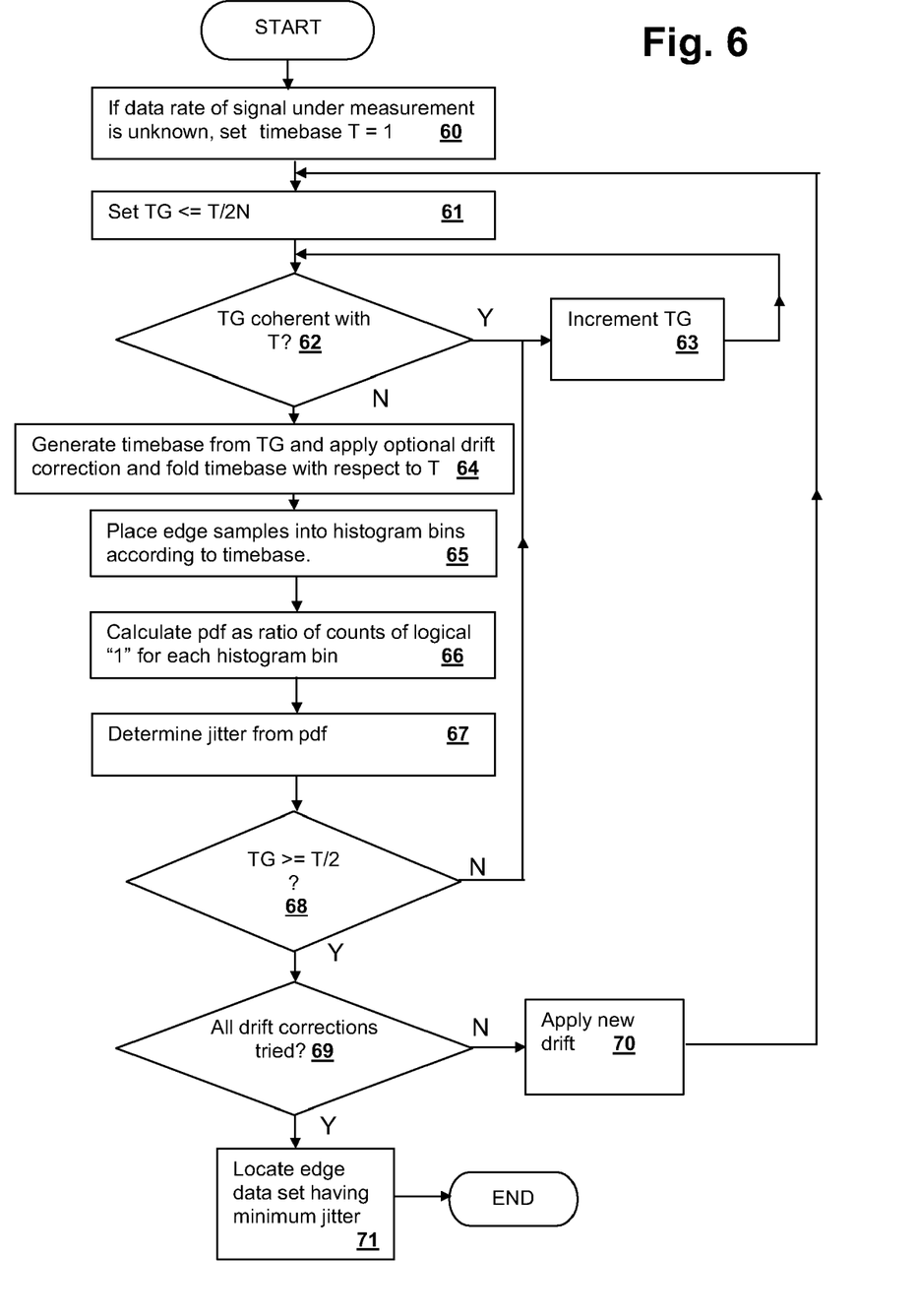

Referring now to FIG. 6, details of the timebase period determination of step 52 of FIG. 5 are shown in a flowchart. First, if the period of the data signal under measurement is known, then T is set to that period, otherwise T is set to 1 (step 60). Next, an initial guess of the sampling clock period TG is made as a number <=T/2N (step 61). A coherency check is made on the relationship between T and TG to reject clock period guesses that are closely related (decision 62) and if the coherency check fails, TG is incremented (step 63). Next, a timebase is calculated as tbase={TG, 2TG, 3TG . . . N*TG} modulo T, an optional drift correction is applied, and the edge position samples are folded to a unit interval using the optionally drift-corrected timebase (step 64). The edge position samples are then binned into histogram bins according to the sub-intervals indicated by the timebase (step 65) and the probability density function (pdf) computed by the count of the logical "1" values each bin (step 66). The jitter is determined from the pdf (step 67). At one particular TG value, the jitter value will drop dramatically, with a sharp peak in the pdf indicating that TG is at the correct value per step 71. Even a small deviation in period from the actual period of the sampling clock will result in an essentially equal distribution of values across the bins if a sufficient number of values are collected, and thus a high jitter value in the folded edge position data.

The above-described steps from decision 62 to step 67 are repeated for all increments of TG up to T/2 (decision 68). Also, until all desired drift corrections are applied (decision 69), new drift corrections are applied (step 70) and step 61 through decision 68 are repeated. After the edge position data values have been analyzed over all timebase periods and drift corrections, the TG period for which the minimum jitter is present (step 71) is taken as the correct clock period and the edge data histogram for the period is also used in step 54 of FIG. 5 to determine the eye diagram crossing location. The method described in FIG. 6 can be used in conjunction with the method disclosed in the above-incorporated U.S. patent application "METHOD AND APPARATUS FOR DETERMINING DATA SIGNAL JITTER VIA ASYNCHRONOUS SAMPLING", in order to determine jitter characteristics of the data signal.

Figure 7A:
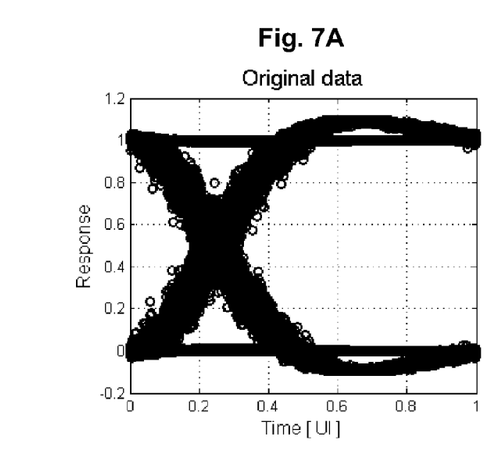
FIGS. 7A-7E are graphs depicting data processing operations and measurements in a method according to an embodiment of the present invention.

Referring now to FIGS. 7A-7D, the graphs depicted illustrate the method described above with respect to FIGS. 5 and 6. FIG. 7A shows the input data signal when sampled at the correct TG, provided here for illustrative purposes. The nominal crossing of the large bands seen in the data set corresponds to the location of the nominal data rate with respect to the sampling clock period.

Figure 7B:
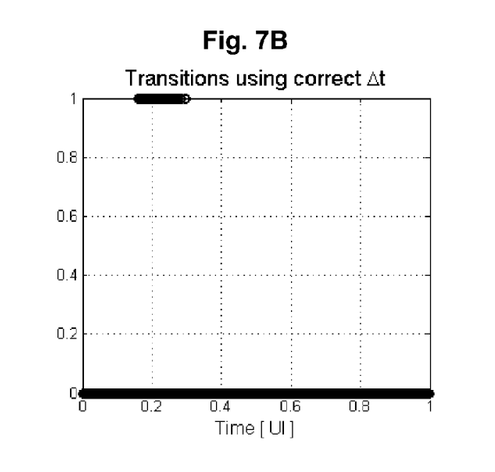

FIG. 7B shows the distribution of accumulated edge sample values (corresponding 1V and 0V) after folding with the correct estimated period. The overlapping regions correspond to the range of time across which data signal transitions are spread are due to jitter. The period in the graphs is expressed as the modulo remainder of the position in the timebase period with respect to T, which provides a unit interval of reference for the folded data. The position in the period is calculated as t={TG, 2TG, 3TG . . . N*TG} modulo T.

Figure 7C:
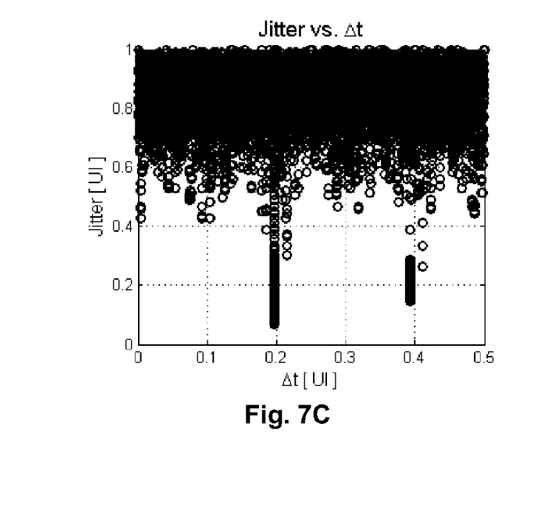
Figure 7D:
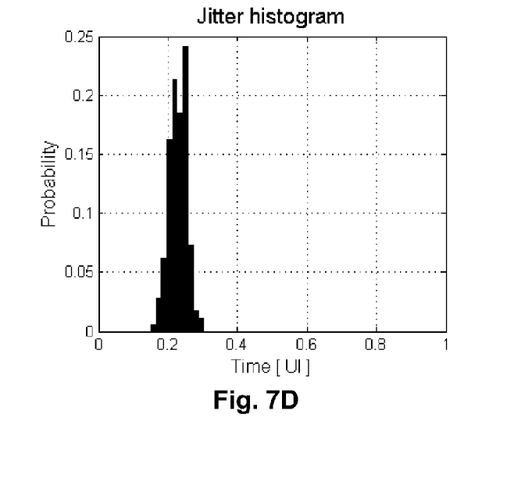

FIG. 7C shows a graph of estimated jitter vs. sampling clock period. The sharp drop in jitter at approximate period ?t=0.2 indicates the correct sampling clock period. FIG. 7D shows the distribution of edge values in the histogram after finding the correct period.

Figure 7E:
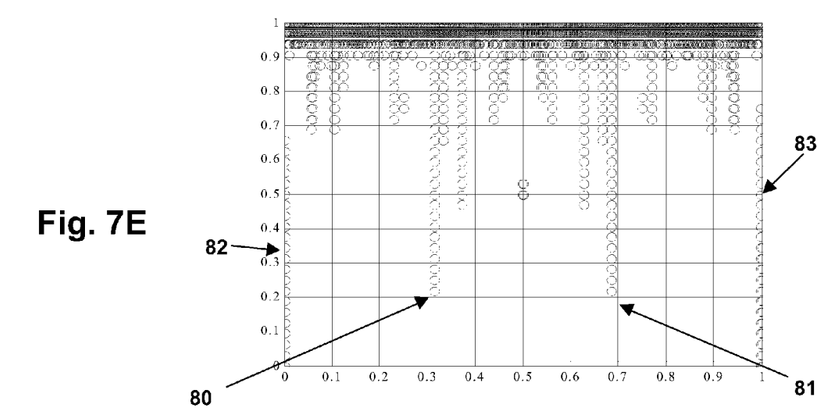

Referring now to FIG. 7E a graph of jitter versus sampling clock period is shown across the unit interval from a zero modulus period 82 corresponding to a zero difference in periods between the data signal under measurement and the sampling clock, to a period 83 that indicates a difference in clock periods corresponding to one clock being twice the frequency of the other. (The 1.0 and 0 values are essentially the same point on the unit interval since mod [2T/T]=0.)

The very low jitter values at periods 82 and 83 are due to the DC value yielded from the sample set being read at effective identical positions within the waveform of the clock under measurement, i.e. coherent sampling, which is rejected by the above-described method in step 62 of FIG. 6. Periods 80 and 81 are the correct estimated periods, having the minimum amount of actual jitter and correspond to modulus of the ratio between the data signal data rate and the sampling clock periods. As can be observed from the figure, the graph is symmetrical around T/2, so the estimated period only needs to be swept over half of the unit interval. The other drops in jitter value correspond to products of harmonic relationships of higher order between the guessed period, the sampling clock and the data signal data rate.

Figure 8:
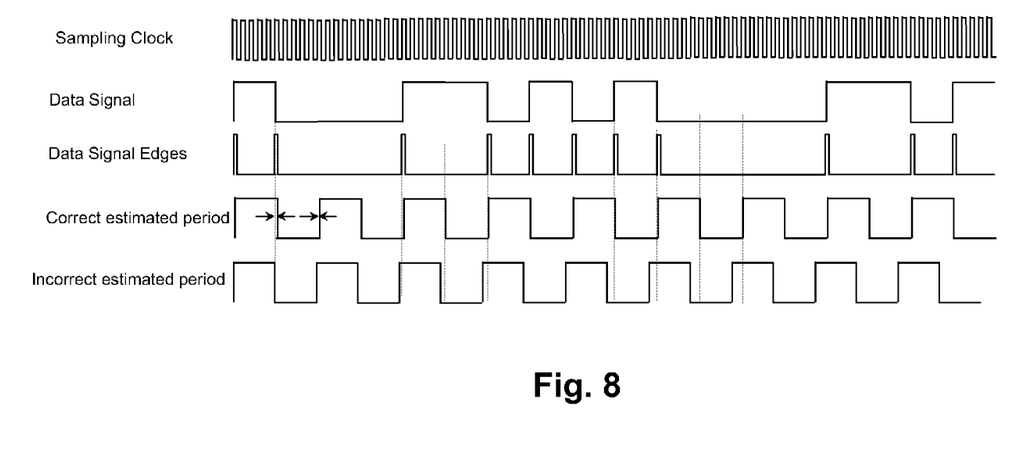
FIG. 8 is a timing diagram illustrating a method of determining estimated clock periods in accordance with an embodiment of the invention.

Referring now to FIG. 8, a pictorial diagram illustrating the folding technique is shown. The illustration is a simplified diagram that illustrates a Sampling Clock signal providing an oversampling factor of approximately, but not exactly 10, where in actuality the data signal may be oversampled or undersampled. The Data Signal is the actual data signal under measurement and Data Signal Edges signal is the output of edge detector 20 of FIG. 1. In the scale shown, the output of data signal detector 22 of FIG. 1 will resemble Data Signal for all but the most extreme threshold voltages, for which the output will be a constant "1" or "0". The waveforms beneath, though drawn as continuous waveforms, represent samples in the data set provided by sampling the Data Signal Edges signal with the Sampling Clock signal and selecting specific samples from the data set to "reconstruct" the edges of the Data Signal Edges signal. In the Correct Estimated Period signal, the samples are chosen according to a period that corresponds to the correct relationship between the Data Signal period (data rate) and the Sampling Clock signal period, and therefore only jitter and any deviations in the edge detector pulse width or delay will cause differences between the expected position of an edge and the actual position of the edge in the data set (illustrated by the arrows). For the Incorrect estimated period signal illustrated, the progressive (and cyclic) edge differences will yield a "jitter" distribution that is uniform for large enough sample sets, as the distance between the expected edge locations and the actual edge locations cycle through a full range of phase differences. Therefore, the minimum jitter distribution will occur when the guessed period is equal to the correct sampling clock period.

Figure 9A:
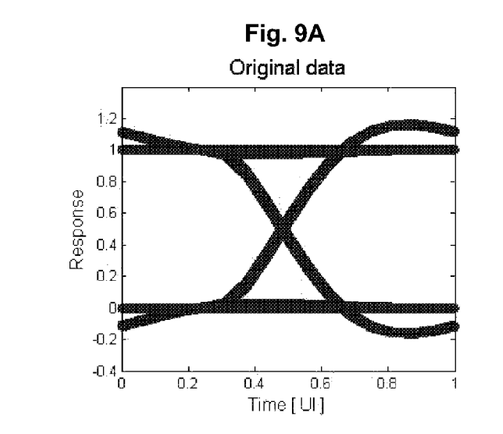
FIGS. 9A-9D are graphs depicting other data processing operations and measurements in a method according to an embodiment of the present invention.
Figure 9B:
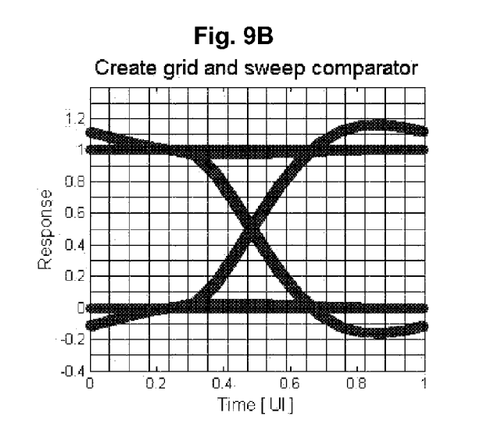
Figure 9C:
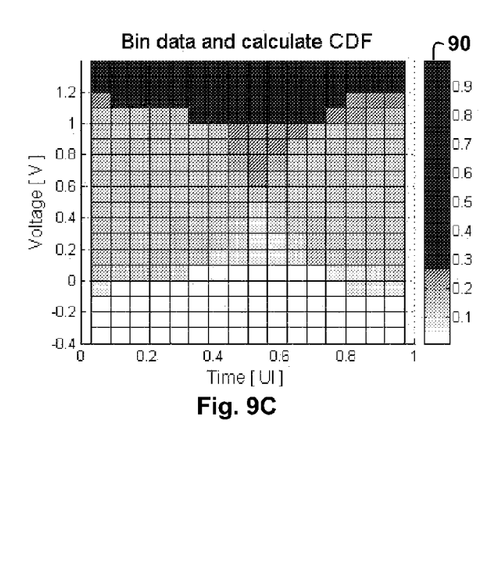
Figure 9D:
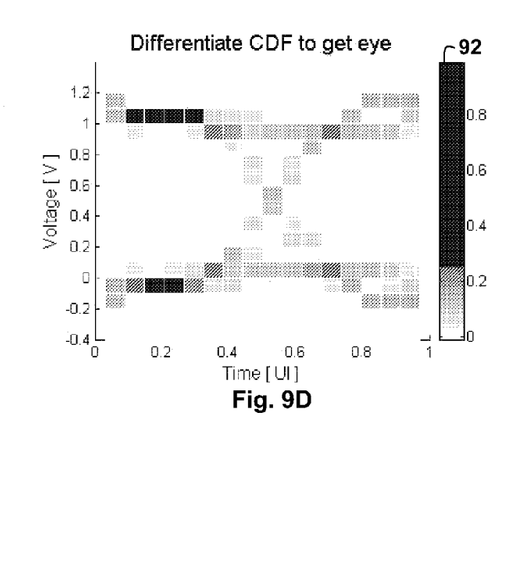

FIGS. 9A-9D illustrate the generation of an eye diagram according to the methods of the present invention. FIG. 9A is provided for illustrative purposes, and is the value of the original data signal prior to sampling, but synchronized to the correct guessed period. FIG. 9B superimposes a voltage grid according to discrete steps of the comparator threshold voltage supplied to data signal detector 22 of FIG. 1. FIG. 9C illustrates the histogram bin data (cdf) versus threshold voltage across the unit interval, with the relative density showing the ratio of count values according to key 90. Similarly, FIG. 9D shows the differentiated histogram (pdf), with the relative density showing the change in count distribution per change in threshold voltage level, according to key 92.

Figure 10A:
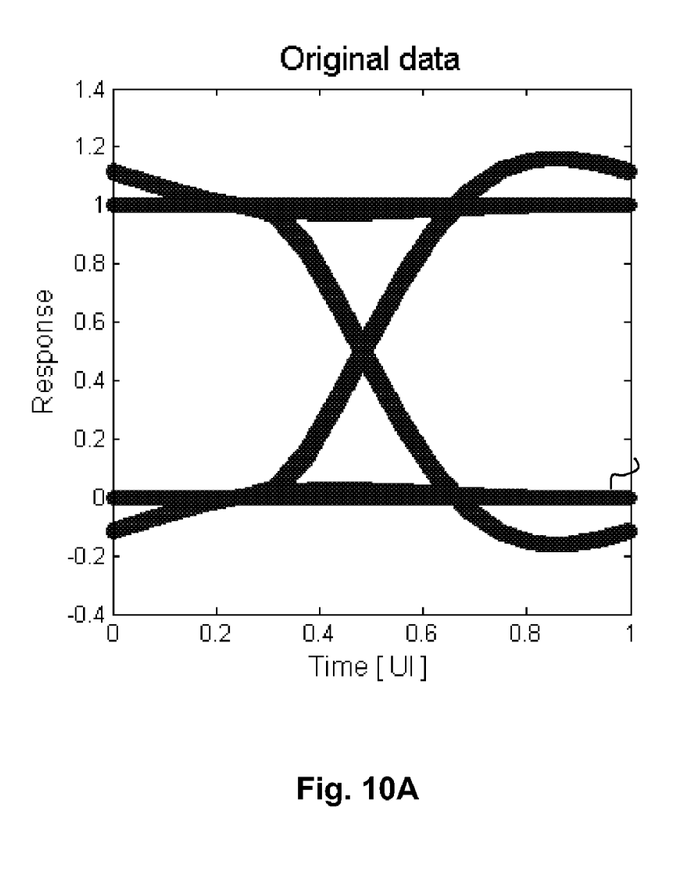
FIGS. 10A and 10B are graphs comparing a eye diagram (FIG. 10B) generated according to an embodiment of the present invention with an actual eye diagram (FIG. 10A) of the signal under measurement.
Figure 10B:
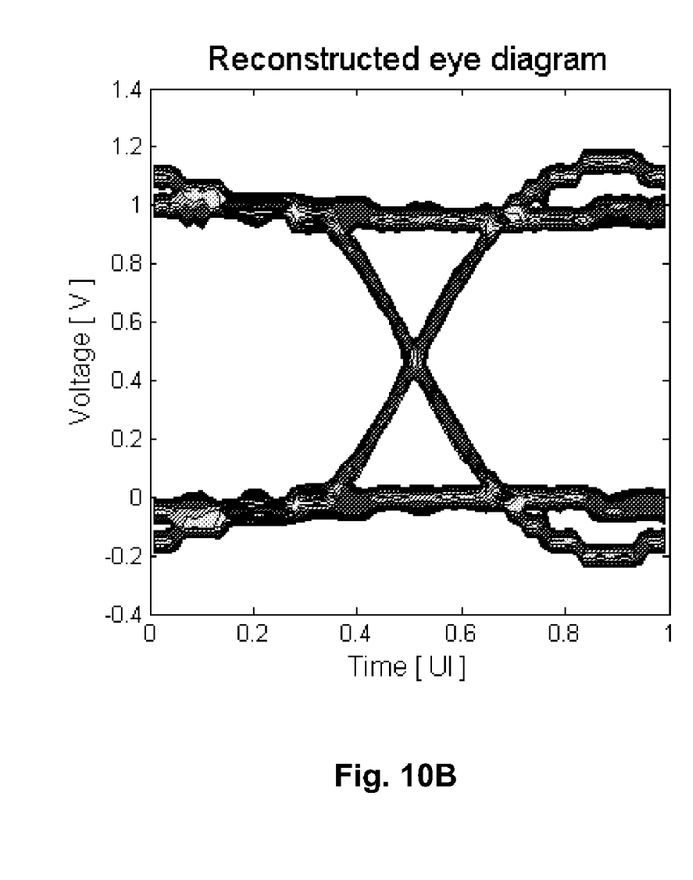

FIG. 10A illustrates an eye diagram as also shown in FIG. 9A, for comparison with a reconstructed eye diagram shown in FIG. 10B as generated according to the above-described method.

Figure 11A:
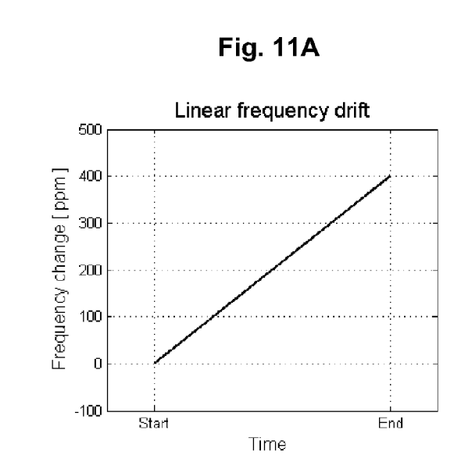
FIGS. 11A-11D are graphs depicting operations in correcting frequency drift in a method according to an embodiment of the present invention.
Figure 11B:
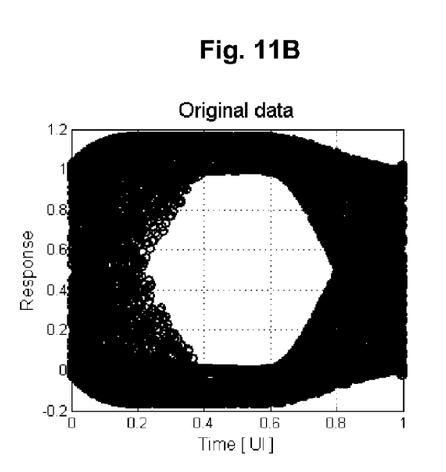
Figure 11C:
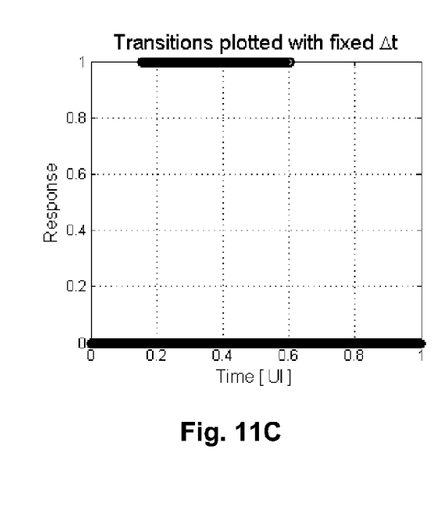
Figure 11D:
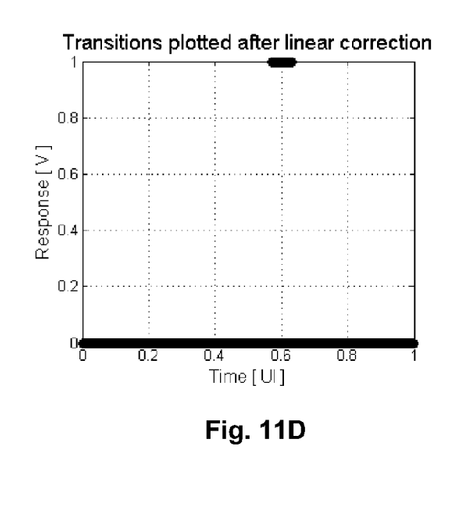

FIGS. 11A-11D illustrate the application of a frequency drift correction function in the methods of the present invention. FIG. 11A depicts an optional drift correction function used to increase or decrease the guessed period progressively over the sample set during the method described above. FIG. 11B illustrates the distribution of the data signal edge samples without drift correction. FIG. 11C illustrates the spread of the data signal edges in time without drift correction and corresponds to FIG. 7B described above. FIG. 11D shows the spread of data signal edges after the proper drift correction has been applied.

The description provided above constitutes a description of the preferred embodiments of the invention, but the invention is not limited to the particular implementations shown or described. Those skilled in the art, having seen the above description and accompanying drawings, will understand that changes in form, structure and other details, as well as the order of operation of any operative steps may be varied without departing from the spirit and scope of the invention.

What is claimed is:

1. A method of generating a signal diagram of a signal under measurement, comprising:
   collecting first samples of indications of edge positions of a first signal at regular intervals having a sampling period differing from a multiple of a period of said first signal;
   collecting second samples of values of said signal under measurement at said regular intervals;
   determining a timebase period corresponding to a relationship between said sampling period and said period of said first signal from said first samples;
   analyzing said second samples in accordance with said determined timebase to provide said signal diagram of said values of said signal under measurement across said period of said first signal; and
   displaying said signal diagram.

2. The method of claim 1, wherein said signal under measurement is said first signal, whereby said signal diagram is an eye diagram of said signal under measurement.

3. The method of claim 1, wherein said signal under measurement is a signal differing from said first signal, whereby said signal diagram is a diagram displaying variation in said signal under measurement that is synchronous with said period of said first signal.

4. The method of claim 3, wherein said first signal is a clock signal and wherein said collecting first samples collects sampled values of said clock signal.

5. The method of claim 3, further comprising detecting edges of said first signal and wherein said collecting first samples collects sampled values of a result of said detecting.

6. The method of claim 5, wherein detecting is performed by
   generating a pulse commencing when a sampling clock samples a change in said first signal and ending after expiration of a predetermined delay.

7. The method of claim 5, wherein said detecting is performed by
   generating a pulse commencing when said first signal crosses a first transition voltage level and ending when said first signal crosses a second transition voltage level.

8. The method of claim 1, further comprising:
   comparing said signal under measurement to a variable threshold voltage to obtain said values of said signal under measurement;
   setting said threshold voltage to each of a plurality of threshold voltage values during said collecting second samples, whereby said samples provide a cumulative distribution function of a value of said signal under measurement for each of said threshold voltage values;
   populating bins of histograms, one histogram for each of said threshold voltage values, with a ratio of values of said said second samples to obtain a cumulative distribution histogram; and computing a rate of change of counts in corresponding bins of said cumulative distribution histograms with respect to change in corresponding threshold voltage values to obtain said signal diagram.

9. The method of claim 1, wherein said determining said timebase period comprises:

computing an indication of an amount of effective jitter of said first signal for said estimated period; and adjusting said timebase period until a timebase period yielding a minimum amount of said effective jitter is found.

10. The method of claim 1, further comprising changing said timebase period across said first and second samples during said determining to correct for drift in at least one of a width of said regular intervals and said period of said first signal.

* * * * *